US011881682B2

(12) United States Patent
Enderlein et al.

(10) Patent No.: US 11,881,682 B2
(45) Date of Patent: Jan. 23, 2024

(54) FAST MODULATION OF THE RESONANT FREQUENCY OF AN OPTICAL RESONATOR

(71) Applicant: TOPTICA Photonics AG, Gräfelfing (DE)

(72) Inventors: Martin Enderlein, Munich (DE); Manfred Hager, Munich (DE); Thomas A. Puppe, Munich (DE); Frank Lison, Gauting (DE)

(73) Assignee: TOPTICA Photonics AG, Gräfelfing (DE)

( * ) Notice: Subject to any disclaimer, the term of this patent is extended or adjusted under 35 U.S.C. 154(b) by 120 days.

(21) Appl. No.: 17/348,971

(22) Filed: Jun. 16, 2021

(65) Prior Publication Data

US 2021/0391690 A1 Dec. 16, 2021

(30) Foreign Application Priority Data

Jun. 16, 2020 (DE) ...................... 10 2020 115 877.7

(51) Int. Cl.
*H01S 3/13* (2006.01)
*H01S 5/0687* (2006.01)
(Continued)

(52) U.S. Cl.
CPC .......... *H01S 5/0687* (2013.01); *H01S 3/1305* (2013.01); *H01S 3/139* (2013.01);
(Continued)

(58) Field of Classification Search
CPC ...... H01S 5/0687; H01S 3/1305; H01S 3/139; H01S 5/0092; H01S 5/0604; H01S 5/14
See application file for complete search history.

(56) References Cited

U.S. PATENT DOCUMENTS

2003/0214359 A1* 11/2003 Sasho ................... H03F 1/3223
330/310
2006/0192970 A1* 8/2006 Tiemann ................... H01S 3/13
356/454
(Continued)

FOREIGN PATENT DOCUMENTS

DE 10310076 9/2004

*Primary Examiner* — Kinam Park

(57) ABSTRACT

The invention relates to a method for modulating the resonant frequency of an optical resonator (1) in accordance with a periodic, not necessarily harmonic, modulation signal ($U_{mod}(t)$). Fast modulation of an optical resonator is intended to be made possible in which the current resonant frequency follows the modulation signal ($U_{mod}(t)$) as precisely as possible, and specifically at a fundamental frequency of the modulation signal in the kHz range. To do this, the invention proposes the following method steps:

deriving an error signal (E(t)) from a light field circulating in the resonator (1), wherein the error signal (E(t)) indicates the deviation of the optical frequency of the light field from a target value, deriving a first actuating signal ($S_1(t)$) from the error signal (E(t)) by means of a controller (6), generating a second actuating signal ($S_2(t)$), which has actuating-signal components at one or more harmonics ($f_{mod}$, $2f_{mod}$, ...) of the fundamental frequency ($f_{mod}$) of the modulation signal ($U_{mod}(t)$), and applying a superposition signal made up of the first and the second actuating signal ($S_1(t)$, $S_2(t)$) to an actuator (3) that changes the optical path length of the resonator (1). In other words, the invention makes use of a combination of control and narrow-band feed-forward control tuned to the spectrum of the modulation signal ($U_{mod}(t)$) and of the error signal (E(t)) to modulate the resonant frequency. Preferably, the feed-forward control used for generating the second actuating signal (Continued)

($S_2(t)$) is automatically adapted in accordance with the error signal ($E(t)$). In addition, the invention relates to an accordingly configured optical system.

24 Claims, 3 Drawing Sheets

(51) Int. Cl.
*H01S 5/06* (2006.01)
*H01S 5/14* (2006.01)
*H01S 3/139* (2006.01)
*H01S 5/00* (2006.01)

(52) U.S. Cl.
CPC .......... *H01S 5/0092* (2013.01); *H01S 5/0604* (2013.01); *H01S 5/14* (2013.01)

(56) References Cited

U.S. PATENT DOCUMENTS

| | | | |
|---|---|---|---|
| 2010/0073086 A1* | 3/2010 | Holonyak, Jr. | H03F 3/08 330/149 |
| 2012/0224243 A1* | 9/2012 | Friedenauer | G01S 17/02 359/238 |
| 2013/0070794 A1* | 3/2013 | Huber | G02B 6/29358 356/454 |
| 2015/0357788 A1* | 12/2015 | Puppe | H01S 3/10046 372/18 |
| 2017/0047705 A1* | 2/2017 | Rausch | H01S 3/1307 |

* cited by examiner

FAST MODULATION OF THE RESONANT FREQUENCY OF AN OPTICAL RESONATOR

RELATED APPLICATION

This application claims the benefit of priority of German Patent Application No. 10 2020 115 877.7 filed on Jun. 16, 2020, the contents of which are incorporated herein by reference in their entirety.

FIELD AND BACKGROUND OF THE INVENTION

The invention relates to a method for modulating the resonant frequency of an optical resonator. In addition, the invention relates to a system comprising an optical resonator, at least one actuator, which is configured to change the optical path length of the resonator, a modulation-signal generator, which is configured to generate a periodic modulation signal to modulate the resonant frequency of the resonator, and zo an error-signal detector, which is configured to derive an error signal from a light field circulating in the resonator. The error signal indicates the deviation of the optical frequency of the light field from a target value. Furthermore, the invention relates to a controller, which is configured to derive an actuating signal from the error signal.

The fast frequency modulation of laser sources that emit in a narrow band using external optical resonators is technically challenging.

The external resonator may for example be the laser resonator of the laser source itself, which contains the optical gain medium as well as other discrete optical elements (such as in a VECSEL). Likewise, the optical resonator may be an additional resonator for frequency stabilization (such as in an ECDL), or it may be an enhancement resonator for the resonant, non-linear frequency conversion, in which the light from a frequency-modulated laser source is coupled in so as to generate accordingly modulated, frequency-converted laser radiation.

It is usually desired for the resonant frequency of the optical resonator to follow a predetermined modulation signal with as little delay as possible. This may be implemented by means of a closed control loop, wherein control deviation in the form of an error signal is detected which indicates the deviation of the resonant frequency from the current frequency target value predetermined by the modulation signal. A controller generates an actuating signal from the error signal and feeds it back to an actuating element of the optical resonator, such that the resonant frequency follows the modulation signal.

The frequency modulation implies a change to the optical path length of the resonator. Therefore, a mechanical actuator (or a plurality of actuators) is usually used as the actuating element. For example, the actuator carries an end mirror of the resonator, wherein a displacement of the actuator changes the geometric length and therefore the optical path length. When designing the actuator, a compromise has to be found between the motion, size and achievable actuating speed of the actuator, wherein the latter limits the control bandwidth of the closed control loop. The control bandwidth is defined as the frequency range from zero up to the maximum frequency at which the phase delay between the actuating signal and the actuator displacement remains less than 90°. Even for optimized actuators, such as small piezoelectric elements or MEMS/MOEMS-based actuators, the control bandwidth is conventionally limited to a range of 1 kHz up to a maximum of 100 kHz.

It should be noted here that the resonance amplification in the optical resonator increases the optical power density. The management of the corresponding heat dissipation requires comparatively sturdy optical elements and therefore actuators having a high mass. This in turn has an impact tending towards a reduced control bandwidth. In addition, the compensation of thermal drifts requires a comparatively large actuator excursion and therefore, once again, a comparatively large and thus slow actuator.

In laser systems, the laser medium itself would allow for a significantly higher modulation frequency. In a solid-state laser, for example, the effective optical path length of the laser resonator and therefore the emission frequency can be changed by the charge carrier density and thus by the operating current. Modulation of the operating current and thus of the current emission frequency is possible into the GHz range in principle.

There are applications (which will be discussed in greater detail below) which require fast modulation of the resonant frequency of an optical resonator, wherein it is possible for the modulation signal to be periodic, but not necessarily harmonic (e.g. sawtooth-shaped). A modulation signal of this kind has a distinct harmonic series, which falls outside of the range of conventionally achievable control bandwidths even if the fundamental frequency of the modulation is still in the range accessible using conventional methods. Even with a harmonic modulation signal, the detected error signal and the actuating signal which has been accordingly fed back to the actuator can have a distinct harmonic series, which results from non-linearities of the mechanical, optical and electronic components used. In such cases, too, the conventional control cannot ensure precise modulation. The progression over time of the optical path length is delayed and distorted compared with the modulation signal.

There is therefore the need to make possible fast modulation of an optical resonator in which the current resonant frequency follows a periodic, not necessarily harmonic, modulation signal as precisely as possible, and specifically at a fundamental frequency of the modulation signal in the kHz range.

SUMMARY OF THE INVENTION

The invention proposes a method for modulating the resonant frequency of an optical resonator in accordance with a periodic modulation signal, comprising the following method steps:
  deriving an error signal from a light field circulating in the resonator, wherein the error signal indicates the deviation of the optical frequency of the light field from a target value,
  deriving a first actuating signal from the error signal by means of a controller,
  generating a second actuating signal, which has actuating-signal components at one or more harmonics of the fundamental frequency of the modulation signal, and
  applying at least one superposition signal made up of the first and the second actuating signal to an actuator that changes the optical path length of the resonator.

In addition, the invention proposes a system comprising
  an optical resonator,
  at least one actuator, which is configured to change optical path length of the resonator,
  a modulation-signal generator, which is configured to generate a periodic modulation signal, an error-signal detector, which is configured to derive an error signal from a light field circulating in the resonator, wherein the error signal indicates the deviation of the optical frequency of the light field from a target value, a controller, which is configured to derive a first actuating signal from the error signal, a feed-forward control apparatus, which is configured to generate a second actuating signal, which has actuating-signal components at one or more harmonics of the fundamental frequency of the modulation signal, wherein the controller and the feed-forward control apparatus are connected to the at least one actuator, such that a superposition signal made up of the first and the second actuating signal is applied to said actuator.

The target value may be the resonant frequency of the optical resonator or, if the optical frequency of the light field is already the resonant frequency of the optical resonator, the optical frequency of an additional (reference) light field or the resonant frequency of a second resonator.

The error signal and the first actuating signal are derived by means of the controller, e.g. by means of the Pound-Drever-Hall technique or the Hänsch-Couillaud technique. To do this, the laser radiation, which is frequency-modulated in accordance with the modulation signal and is emitted by a laser source (e.g. by a solid-state laser), can be coupled into the resonator. The error signal then indicates the deviation of the resonant frequency of the resonator from the current frequency of the laser radiation from the laser source circulating in the resonator. The controller (e.g. a PID controller) actuates the actuator on the basis of the error signal such that the resonant frequency follows the current frequency of the frequency-modulated laser radiation.

In order to achieve the desired fast modulation of the resonant frequency, as part of the feed-forward control, the second actuating signal is additionally generated, which comprises the actuating-signal components at a plurality of, i.e. at least two, preferably at least three, harmonics of the fundamental frequency of the modulation signal. A superposition signal made up of the first actuating signal (from the controller) and the second actuating signal (from the feed-forward control) is then applied to the actuator. For the reasons set out above, the bandwidth of the closed control loop is not sufficient at the high frequencies of the harmonics of the modulation signal. The approach of the invention involves compensating for the phase offset of the optical path length of the resonator relative to the modulation signal, which offset arises at these high frequencies, by applying actuating-signal components to the actuator at the harmonics as part of the feed-forward control.

In a possible configuration, the phase and the amplitude of each actuating-signal component of the second actuating signal are individually set such that the amplitude of the error signal is minimal at the associated harmonics. In other words, this means that the feed-forward control is designed such that the phase offset of the optical path length arising at each harmonics is addressed and compensated for individually. In order to balance out fluctuations and drifts, the settings of the phases and amplitudes of the actuating-signal components are preferably continuously, automatically adapted in this case, such that the error signal continues to be kept to a minimum. This adaptation can be carried out at a considerably lower frequency than the frequency spectrum of the modulation signal. In this configuration, the second actuating signal is also derived from the error signal, but not as part of control, like the first actuating signal, but instead for the (slow) adaptation of the feed-forward control.

The proposed solution can therefore be referred to as an adaptive feed-forward model for suppressing narrow-band interference which is induced by the high-frequency periodic modulation. In this context, "high-frequency" means that the modulation signal and/or the error signal contains components at harmonics of the fundamental frequency which are at higher frequencies than those that can be adequately processed using the conventional control with feedback. Mechanical resonances or low-pass characteristics of the actuator result in a frequency response which limits the control bandwidth when just using a control loop having a continuous, wide-band frequency response (e.g. a PID controller). The proposed model is a combined control model and adaptive feed-forward control model. The feed-forward control provides high, narrow-band amplification at the harmonics of the fundamental frequency of the modulation signal. The feed-forward control supplements the primary (wide-band) control loop such that the combination has a spectrally modulated characteristic that makes it possible to effectively counteract the spectrum of the interference and the noise.

In a possible configuration, each actuating-signal component of the second actuating signal is generated by phase-sensitive demodulation of the error signal at the associated harmonics, transfer of the resulting complex detection signal into a complex control signal in accordance with a transfer function and modulation of the associated harmonics ($f_{mod}$, $2f_{mod}$, . . . ) in accordance with the complex control signal. In this configuration, the actuating-signal components of the second control signal are generated over multiple channels, i.e. separately at the discrete frequencies of the harmonics of the modulation signal. In each channel, the error signal is first demodulated at the assigned harmonics in order to obtain the error-signal component at the corresponding frequency in a narrow band. The demodulation is carried out in a phase-sensitive manner here, such that the detection signal obtained is complex-valued. In this configuration, the core concept of the feed-forward control is the transfer of the detection signal into the (likewise complex-valued) control signal. This transfer determines the response of the feed-forward control to the error signal at the relevant harmonics. The transfer is carried out in accordance with a predetermined transfer function. The transfer function associates an amplitude and phase value of the control signal with each possible amplitude and phase value of the detection signal, such that the error-signal component is minimized at the associated harmonics, i.e. the relevant detection signal. The transfer function can e.g. be stored in the form of a look-up table or can be predetermined by a suitable mathematical function. Preferably, an individual transfer function is associated with each actuating-signal component, i.e. each channel of the feed-forward control. The associated harmonics is then in turn modulated in amplitude and phase in accordance with the control signal, such that an actuating-signal component of the second actuating signal is generated at the frequency of the associated harmonics in each channel in a narrow band before said signal is combined with the first actuating signal and fed to the actuator.

In another embodiment, the transfer function is automatically (slowly, i.e. at a frequency that is lower than the fundamental frequency of the modulation signal) adapted (e.g. by adapting the look-up table or by varying the parameters of the mathematical function used) in order to compensate for changes to the or in the closed control loop due to external influences (pressure, temperature, ageing). For adapting the feed-forward control, a suitable optimization algorithm, such as a gradient method, can be implemented, e.g. using a microcontroller.

In order to implement the described adaptive feed-forward control in the system, a feed-forward control apparatus may be provided which has a multi-channel structure, wherein each channel is assigned to an actuating-signal component of the second actuating signal, i.e. harmonics of the fundamental frequency of the modulation signal. In this case, each channel comprises an IQ demodulator, which is configured to generate a complex detection signal by phase-sensitive demodulation of the error signal at the associated harmonics. The IQ demodulator operates in accordance with the known IQ method (also called quadrature detection), in which the phase information of the error signal is retained at the associated harmonics. To do this, the error signal is mixed with a signal at the associated harmonics and with a signal that has been phase-shifted by 90° therefrom, in order to obtain the real part and the imaginary part of the detection signal. Furthermore, an IQ controller is provided in each channel, which is configured to convert the complex detection signal into the complex control signal in accordance with the transfer function, as previously described. The IQ controllers of the individual channels are expediently implemented by a microcontroller or a suitable FPGA. Lastly, each channel comprises an IQ modulator arranged downstream of the IQ controller. The IQ modulator mixes the complex control signal with a signal at the associated harmonics, again in accordance with the quadrature method. The actuating-signal components thus generated can be individually controlled by means of the IQ controller in accordance with phase and amplitude in each channel, i.e. for each harmonics of the fundamental frequency of the modulation signal. An adder superposes all the actuating-signal components on the second actuating signal, which is then fed to the actuator of the optical resonator together with the first actuating signal.

The modulation signal predetermines the intended resonant frequency of the optical resonator. In order to generate the error signal for the proposed method, a measure of the actual, current optical path length of the resonator is required. Depending on the application, the error signal can be generated in various ways:

In a possible configuration, the optical resonator is a laser resonator (i.e. comprising a gain medium in the resonator) of a laser that is frequency-modulated in accordance with the modulation signal, wherein the error signal is generated by coupling the frequency-modulated laser to a reference laser that emits at a fixed frequency. The coupling can be carried out by superposing the laser radiation of the reference laser, comprising the laser radiation coupled out of the laser resonator of the frequency-modulated laser, on a photodetector, wherein the beat signal is mixed with a high-frequency signal from a local oscillator, which is frequency-modulated in accordance with the modulation signal, e.g. by using a voltage-controlled oscillator (VCO). The thus modulated beat signal underlies the proposed combination of control and feed-forward control as an error signal, such that the modulation is transferred to the laser resonator, the resonant frequency of which then follows the modulation signal as a result.

In an alternative configuration, the optical resonator is in turn a laser resonator of a frequency-modulated laser, wherein the error signal is generated by coupling the frequency-modulated laser to an additional, passive optical resonator, the resonant frequency of which is modulated in accordance with the modulation signal. In this configuration, a passive optical resonator is therefore already present, the resonant frequency of which is modulated in accordance with the modulation signal. The optical path length of this optical resonator is intended to be transferred to the laser resonator by means of the proposed method. To do this, the laser resonator is coupled to the passive optical resonator. This is expediently carried out by coupling the laser radiation coupled out of the laser resonator into the passive resonator. The error signal can then be derived from the laser radiation that is reflected by the passive resonator or transmitted by the resonator, e.g. by means of a Pound-Drever-Hall technique or a Hänsch-Couillaud technique.

In another alternative configuration, the optical resonator is a passive optical resonator, wherein the error signal is generated by coupling to a laser which is frequency-modulated in accordance with the modulation signal. In this configuration, the frequency-modulated laser radiation is already present and the resonant frequency of the optical resonator is intended to follow the frequency of the laser radiation. In this case, the optical resonator can be a passive resonator, in which e.g. a non-linear medium is located for the resonant, non-linear frequency multiplication of the laser radiation emitted by the frequency-modulated laser. Alternatively, a gain medium may be located in the optical resonator, in order to resonantly amplify the frequency-modulated laser radiation. The coupling is expediently carried out by coupling the laser radiation emitted by the laser into the optical resonator. The error signal can then be derived from the laser radiation that is reflected by the resonator or transmitted by the resonator, e.g. in turn by means of a Pound-Drever-Hall technique or a Hänsch-Couillaud technique.

In a possible advantageous application of the modulation technique that is described in greater detail above and in the following, the optical resonator may be an external resonator of a VECSEL or an ECDL. The optical path length of the external resonator can be modulated at a frequency of 1-100 kHz.

Another possible advantageous application of the modulation technique that is described in greater detail above and in the following comes about in the field of laser systems for generating artificial guide stars as a reference for adaptive optics of large astronomical telescopes.

Laser systems of this kind emit at a high power of 20 W or greater, and specifically at a line width of a few GHz up to fewer than 5 MHz at the sodium resonance of 589 nm (sodium D-line). In this case, the laser light is generated such that its spectrum comprises two lines, namely at the fluorescence frequency and a back-pumping frequency. The fluorescence frequency excites the fluorescence of the corresponding sodium resonance. The back-pumping frequency is detuned by the amount corresponding to the hyperfine splitting of the sodium line in question compared with the fluorescence frequency and causes the excitation electron to be "pumped back" out of the non-resonant state and to thus be available for the fluorescence process again. In this way, the intensity of the fluorescent light can be increased (cf. R. Holzlöhner et al., "Optimization of CW sodium laser guide star efficiency", Astronomy & Astrophysics, 510, A20, 2010).

DE 10 2011 011 290 A1 describes a laser system that is suitable for generating an artificial guide star in principle. In this system, the electromagnetic radiation emitted by a laser-light source is modulated before it is amplified to the required power. In this process, the spectrum of the non-amplified radiation obtains components at the carrier frequency and in at least one sideband. The at least one sideband is also amplified by the downstream optical amplifiers, which are preferably Raman fiber amplifiers, since the bandwidth of the amplification of the Raman fiber amplifier is greater than the frequency distance of the sideband from the carrier frequency. In the subsequent frequency multiplication, the free spectral range of the resonant frequency multiplier is tuned to the frequency of the spectral components to be generated. Therefore, after converting the radiation, radiation amplified by means of the frequency multiplier is obtained, the spectrum of which contains components at the fluorescence frequency and the back-pumping frequency. In the process, the carrier frequency corresponds to the desired fluorescence frequency, while the frequency distance of the back-pumping frequency from the fluorescence frequency corresponds to the hyperfine splitting of the atomic line. For generating an artificial guide star, it is sufficient for the power of the obtained radiation to be in the range of 20 W using this method of amplification by means of the Raman fiber amplifier and following the frequency multiplication, since an effective increase in the intensity of the fluorescence occurs owing to the back-pumping frequency contained in the spectrum of the radiation.

In order to further increase the brightness of the artificial guide star, further frequency modulation of the carrier frequency of the laser radiation can be applied in addition to the described sideband modulation (also called laser chirping). The mesospheric sodium atoms, which absorb the laser photons and re-emit them towards the ground, are influenced by the recoil occurring in the process and therefore undergo a Doppler shift of an average of 50 kHz per photon emission. After a series of absorptions and re-emissions, the laser photons can no longer interact with the sodium atom in question owing to the accumulated Doppler shift, and the atom has moved into another speed class. In laser chirping, the carrier frequency of the laser radiation that is sideband-modulated at the back-pumping frequency is modulated such that it follows the atoms into the respectively subsequent speed class. This class then also contains other sodium atoms that were not previously able to interact with the laser radiation. The total number of sodium atoms that interact with the laser radiation thus increases, while the frequency of the laser radiation follows the Doppler shift of the sodium atoms. As a result, the intensity of the fluorescence radiation, i.e. the brightness of the guide star, is accordingly increased. The Doppler shift of the sodium atoms is effective for time periods which correspond to the average collision time of the sodium atoms in the mesosphere. This can be estimated to be 150-200 µs. It follows that, in laser chirping, the laser frequency is intended to be varied approximately in a sawtooth shape, and specifically at a repetition rate of 1-20 kHz and with a modulation amplitude of approximately 200 MHz. It is crucial for this efficiency that the laser frequency is very quickly brought back to the starting value (vertical flank of the sawtooth) after passing through the linear chirp. In order to achieve this, the described modulation method can advantageously be used.

In an advantageous configuration, the laser radiation of the frequency-modulated laser is accordingly converted (preferably after amplification of the laser radiation) by resonant frequency multiplication and/or sum-frequency generation by means of a non-linear optical crystal in the optical resonator. The spectrum of the converted laser radiation then has a fluorescence frequency, which corresponds to an optical transition in an atom, i.e. a line in the electronic excitation spectrum of the atom, and a back-pumping frequency, the distance of which from the fluorescence frequency corresponds to the hyperfine splitting of the optical transition. In the process, the fluorescence frequency is modulated in a sawtooth shape in accordance with the modulation signal, wherein the fundamental frequency of the modulation signal is 1-20 kHz, preferably 5-10 kHz, and the modulation amplitude of the fluorescence frequency is 5-500 MHz, preferably 100-300 MHz, particularly preferably 200 MHz. When generating the artificial guide star by fluorescence excitation of mesospheric sodium atoms, the fluorescence frequency corresponds to the wavelength of the sodium line at 589 nm and the frequency distance corresponds to the back-pumping frequency from the fluorescence frequency +/−1.7 GHz.

BRIEF DESCRIPTION OF THE SEVERAL VIEWS OF THE INVENTION

Exemplary embodiments will be explained in greater detail in the following with reference to the drawings, in which.

DESCRIPTION OF SPECIFIC EMBODIMENTS OF THE INVENTION

Figure 1:
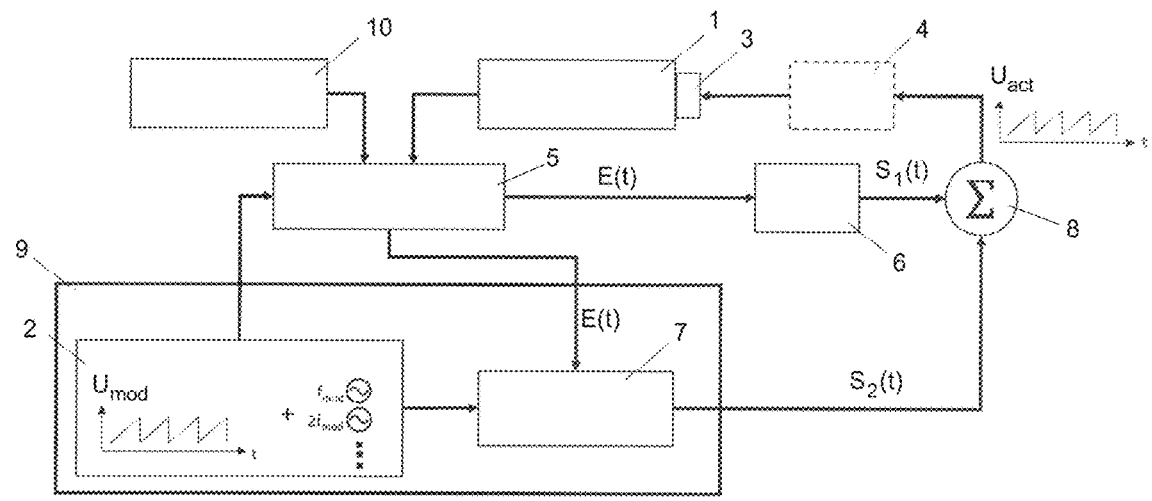
FIG. 1 is a block diagram of a laser system in a first embodiment.

Identical or corresponding elements are provided with identical reference signs in the drawings.

Figure 4:
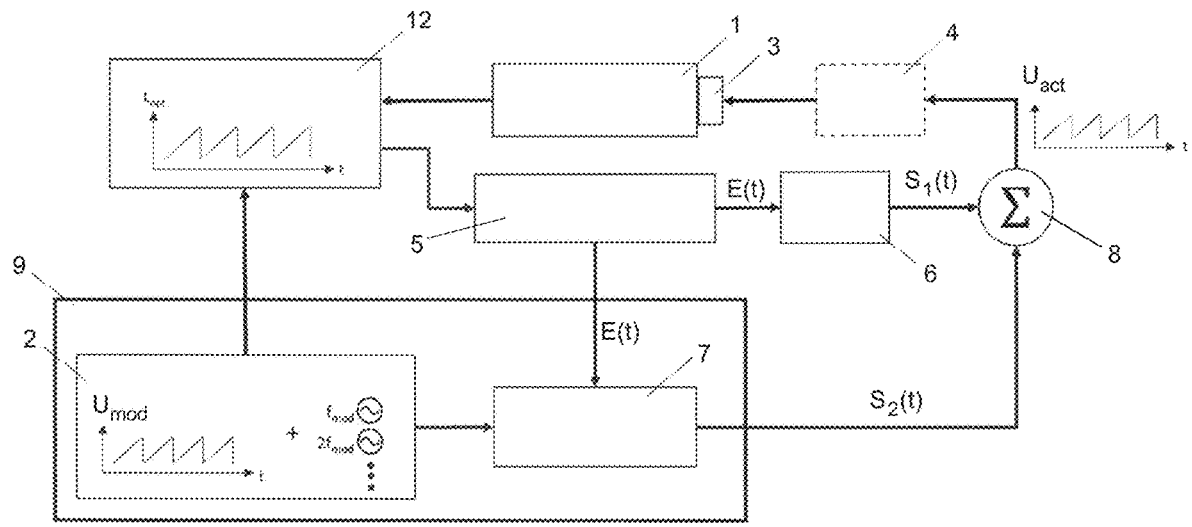
FIG. 4 is a block diagram of a laser system in a third embodiment.

In all the exemplary embodiments, the resonant frequency, i.e. the optical path length of an optical resonator 1, is intended to be modulated, and specifically in accordance with a modulation signal $U_{mod}(t)$ which is periodic, but not harmonic. In the exemplary embodiments shown, the modulation signal $U_{mod}(t)$ is sawtooth-shaped. The modulation signal $U_{mod}(t)$ is generated by means of a modulation-signal generator 2. As shown in FIGS. 1 and 4, the optical resonator may e.g. be a laser resonator comprising a gain medium, wherein the frequency of the emitted laser radiation is intended to be modulated in accordance with the modulation signal $U_{mod}(t)$. The optical path-length modulation is generated by a signal $U_{act}(t)$ applied to an actuator 3, which is e.g. a piezo actuating element, which is (optionally) amplified by means of a suitable power amplifier 4.

An error-signal detector 5 is provided to derive an error signal E(t) from a light field circulating in the resonator 1, wherein the error signal E(t) indicates the deviation of the optical frequency of the light field from a target value. The target value may be the resonant frequency of the optical resonator itself (FIG. 3), of a second resonator (FIG. 4), or the optical frequency of another light field, which is used as a reference (FIG. 1). A controller 6, i.e. a PID controller, generates a first actuating signal $S_1(t)$, which is fed back to the actuator 3 of the optical resonator 1. The control loop formed by the error-signal detector 5 and the controller 6 corresponds to standard control for stabilizing an optical resonator to the frequency of a light field, e.g. in accordance with a Pound-Drever-Hall method or a Hänsch-Couillaud method.

The modulation signal $U_{mod}(t)$ and the signal $U_{act}(t)$ applied to the actuator 3 contain frequency components at harmonics $f_{mod}$, $2f_{mod}$, $3f_{mod}$, ... of the fundamental frequency $f_{mod}$ of the modulation signal $U_{mod}(t)$. In the sawtooth-shaped signal curve shown having a vertical signal drop, the modulation signal $U_{mod}(t)$ contains distinct frequency components at higher harmonics. The frequencies of these harmonics are outside the control bandwidth of the closed control loop formed by the controller 6. The reasons for this are e.g. mechanical resonances and/or a low-pass characteristic of the actuator 3.

In order to generate the signal $U_{act}(t)$ applied to the actuator 3 such that the desired optical path length of the resonator 1 results in accordance with the modulation signal $U_{mod}(t)$, the closed control loop formed by the controller 6 is supplemented by a feed-forward control apparatus 7. This generates a second actuating signal $S_2(t)$, which has actuating-signal components at (some) harmonics $f_n = n \times f_{mod}$, i.e. $f_{mod}$, $2f_{mod}$, $3f_{mod}$, ... of the fundamental frequency $f_{mod}$ of the modulation signal $U_{mod}(t)$. In other words, the feed-forward control apparatus 7 has narrow-band amplification at the harmonics $f_n$ of the modulation signal $U_{mod}(t)$. The power of the closed control loop comprising the controller 6 is limited if it is a question of a narrow-band interference, in particular at frequencies close to or above the mechanical resonant frequencies of the actuator 3. Therefore, the additional feed-forward control apparatus 7 is designed such that it has high amplification at the harmonic components of the fundamental frequency of the modulation signal $U_{mod}(t)$. The combined amplification behavior of the closed control loop and the feed-forward control corresponds to that of a single loop filter of which the spectrally modulated amplification makes it possible to effectively counteract the interference spectrum, depending on the modulation signal $U_{mod}(t)$ and the response behavior of the actuator 3.

Figure 2:
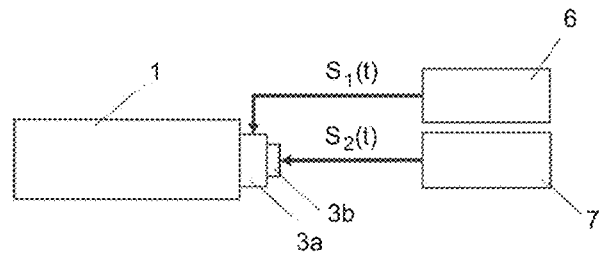
FIG. 2 is a schematic view of the actuation of the actuators of an optical resonator.

The controller 6 and the feed-forward control apparatus 7 are connected to the actuator 3 (optionally to an interposed amplifier 4) by means of an adder 8, such that the signal $U_{act}(t)$, as a superposition signal made up of the first actuating signal $S_1(t)$ and the second actuating signal $S_2(t)$, is applied to the actuator 3. Alternatively, it may be advantageous to use separate actuators 3a and 3b for the controller 6 and the feed-forward control apparatus 7, as shown in FIG. 2, e.g. a slow "woofer" 3a for the controller 6 and a faster "tweeter" 3b for the feed-forward control apparatus 7.

In the exemplary embodiments shown, the modulation-signal generator 2 and the feed-forward control apparatus 7 are combined to form a modulation unit 9. The modulation-signal generator 2 generates the modulation signal $U_{mod}(t)$ and also phase-synchronous signals at the frequencies $f_{mod}$, $2f_{mod}$, $3f_{mod}$, ..., which are fed to the feed-forward control apparatus 7.

In the exemplary embodiments shown, depending on the application, the error signal E(t) can be generated in various ways:

In the exemplary embodiment in FIG. 1, the optical resonator 1 is a laser resonator (i.e. comprising a gain medium in the resonator) of a laser frequency-modulated in accordance with the modulation signal $U_{mod}(t)$, wherein the error signal E(t) is generated by coupling said laser to a reference laser 10 that emits at a fixed frequency. The coupling is carried out by superposing the laser radiation of the reference laser 10, comprising the laser radiation coupled out of the laser resonator 1 of the frequency-modulated laser, on a photodetector (not shown) of the error-signal detector 5, wherein the beat signal is mixed with a high-frequency signal of a local oscillator (not shown), which is frequency-modulated in accordance with the modulation signal $U_{mod}(t)$, e.g. by using a voltage-controlled oscillator (VCO). To do this, in FIG. 1 the modulation signal $U_{mod}(t)$ is fed to the error-signal detector 5. The thus modulated beat signal underlies the described combination of control by the controller 6 and feed-forward control by the feed-forward control apparatus 7 as an error signal E(t), such that the modulation is transferred to the laser resonator, the resonant frequency of which then follows the modulation signal $U_{mod}(t)$ as a result.

Figure 3:
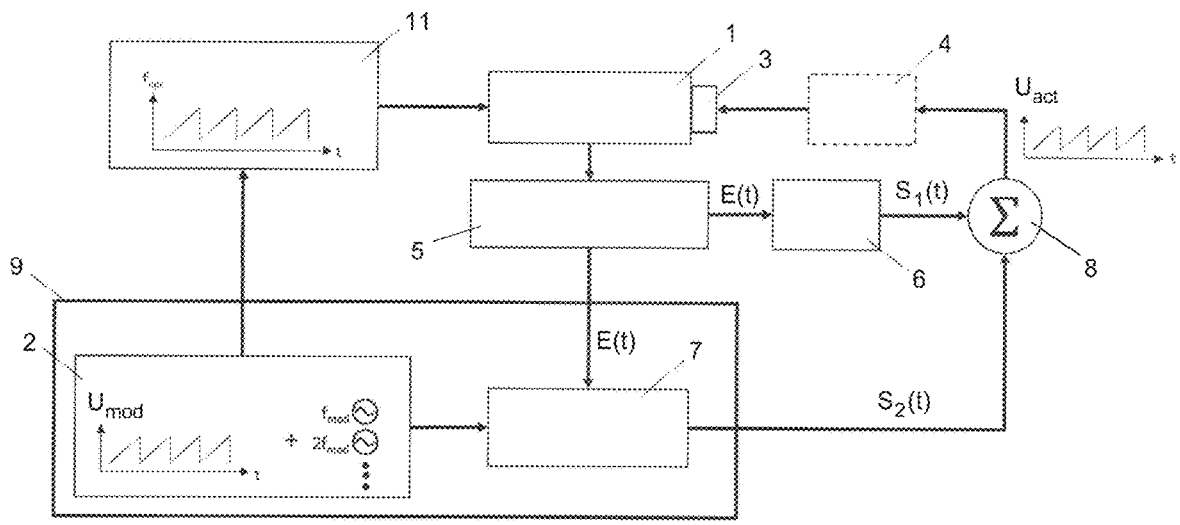
FIG. 3 is a block diagram of a laser system in a second embodiment.

In the exemplary embodiment in FIG. 3, the optical resonator 1 is a passive optical resonator, wherein the error signal E(t) is generated by coupling to a laser 11 which is frequency-modulated in accordance with the modulation signal $U_{mod}(t)$. In this configuration, the frequency-modulated laser radiation is already present and the resonant frequency of the optical resonator 1 is intended to follow the frequency of the laser radiation. The coupling is expediently carried out by coupling the laser radiation emitted by the laser 11 into the optical resonator 1. The error signal E(t) can then be derived from the laser radiation that is reflected by the resonator 1 or transmitted by the resonator by means of the error-signal detector 5, e.g. by means of a Pound-Drever-Hall technique or a Hänsch-Couillaud technique.

In the exemplary embodiment in FIG. 4, the optical resonator 1 is in turn a laser resonator, wherein the error signal E(t) is generated by coupling to another, passive optical resonator 12, the resonant frequency of which is modulated in accordance with the modulation signal $U_{mod}(t)$. In this configuration, a passive optical resonator 12 is therefore already present, the resonant frequency of which is modulated in accordance with the modulation signal $U_{mod}(t)$. The optical path length of this optical resonator is intended to be transferred to the laser resonator 1. The coupling is expediently carried out by coupling the laser radiation coupled out of the laser resonator 1 into the passive resonator 12. The error signal E(t) is then derived from the laser radiation that is reflected by the passive resonator 12 or transmitted by the resonator 12 by means of the error-signal detector 5, e.g. in turn by means of a Pound-Drever-Hall technique or a Hänsch-Couillaud technique.

Figure 5:
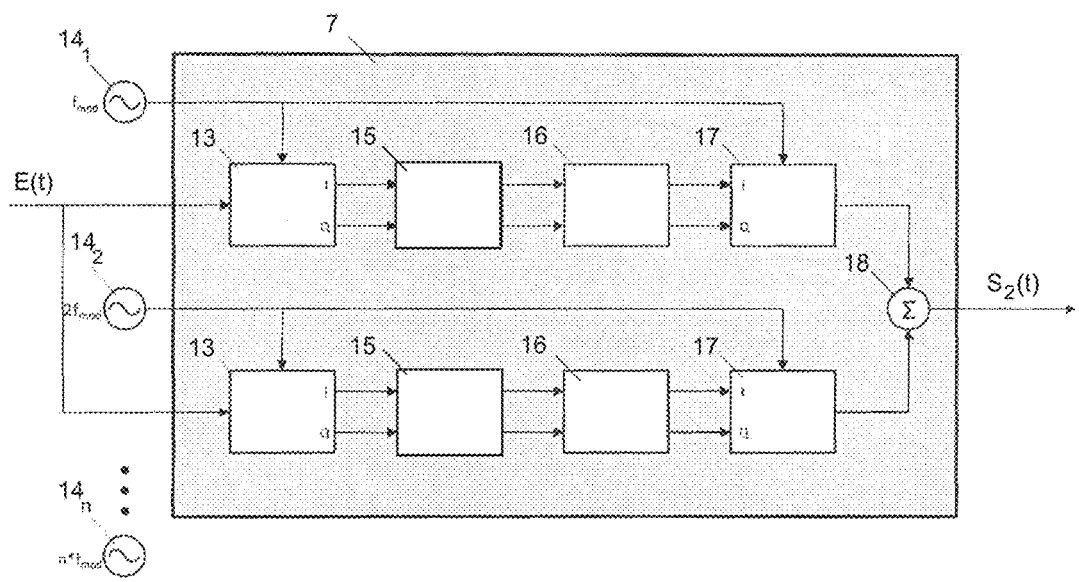
FIG. 5 is a schematic view of a multi-channel feedback controller.

FIG. 5 illustrates the multi-channel structure of the feed-forward control apparatus 7. The error signal E(t) is supplied into the feed-forward control apparatus 7 and is analyzed in a narrow band in the individual channels, which each operate at harmonics $f_n$, in order to generate an actuating-signal component in each channel, i.e. a frequency component of the second actuating signal at the respectively associated harmonics $f_n$. If the error signal E(t) contains frequency components for which the controller 6 is not capable of compensating, actuating-signal components are generated in narrow bands, i.e. at precisely these frequencies, in the relevant channels of the feed-forward control apparatus 7, which components are adapted in terms of phase and amplitude such that the interfering frequency components in the error signal E(t) are counteracted. As shown in FIG. 5, to do this, each channel comprises an IQ demodulator 13, which is configured to generate a complex detection signal by phase-sensitive demodulation of the error signal at the associated harmonics $f_n$. A corresponding signal $14_1$, $14_2$, ... $14_n$ is fed to each channel of the feed-forward control apparatus 7 by the modulation-signal generator 2. The IQ demodulator 13 of each channel operates in accordance with the known IQ method. Furthermore, an IQ controller 15 is provided in each channel, which is configured to convert the complex-valued detection signal of the IQ demodulator 13, having a real part (I signal) and an imaginary part (Q signal), into a likewise complex control signal in accordance with a transfer function. In each channel there is additionally a pre-compensation element 16, which is configured to apply an individual phase correction of the control signal on the basis of previously stored parameters in each channel. In order to ensure the convergence of the combined control and feed-forward control, basic knowledge of the phase response of the entire system may be helpful or even required. This includes each component from the input of the modulation-signal generator 2 up to and including the actuator 3, in particular components having non-trivial phase behavior, such as the amplifier 4. This information is used to subject the real and imaginary part of the control signal in each channel (upstream or downstream of the IQ controller 15) to pre-compensation. This pre-compensation is expediently carried out by means of the pre-compensation element 15 by rotating each IQ coordinate system. In this process, the system-dependent and frequency-dependent rotational angles can be determined in advance as a result of a vector network analysis of the entire system. Lastly, each channel comprises an IQ modulator 17 arranged downstream of the IQ controller 15. The IQ modulator 17 mixes the complex (and pre-compensated) control signal with the corresponding signal $14_1$, $14_2$, ... $14_n$, again in accordance with the quadrature method. The actuating-signal components thus generated can be individually controlled by means of the IQ controller 15 in accordance with phase and amplitude in each channel. An additional adder 18 superposes all the actuating-signal components on the second actuating signal $S_2(t)$, which is then fed to the actuator 3 of the optical resonator 1 together with the first actuating signal $S_1(t)$.

The function and effect of the multi-channel feed-forward control apparatus 7 shown in FIG. 5 are determined by converting the detection signal into the control signal in each channel. This conversion determines the response of the feed-forward control to the error signal E(t). The conversion is expediently carried out in accordance with a predetermined transfer function.

Optionally, the transfer function can be automatically (slowly, i.e. at a frequency that is lower than the fundamental frequency of the modulation signal) adapted in order to compensate for changes to the or in the closed control loop due to external influences (pressure, temperature, ageing). For this adaptation, a microcontroller or FPGA may be used, which is used for the implementation of the entire modulation unit 9. This results in a combination of control by the controller 6 and adaptive feed-forward control by the multi-channel feed-forward control apparatus 7, which together achieve effective compensation of undesired frequency components in the modulation of the optical path length of the resonator 7 in accordance with the modulation signal $U_{mod}(t)$.

Figure 6:
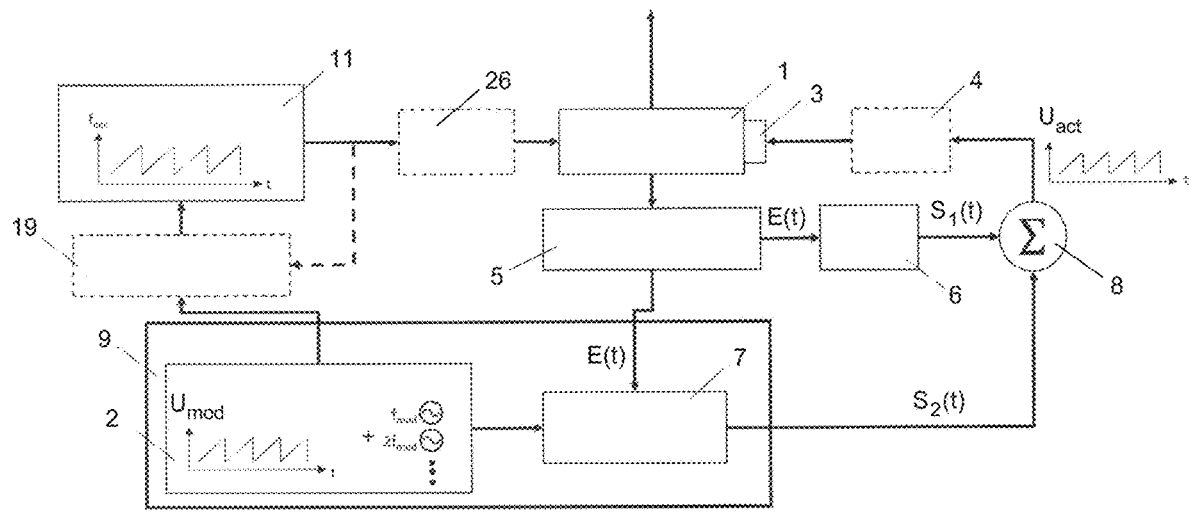
FIG. 6 is a block diagram of a laser system for generating a laser guide star.
Figure 7:
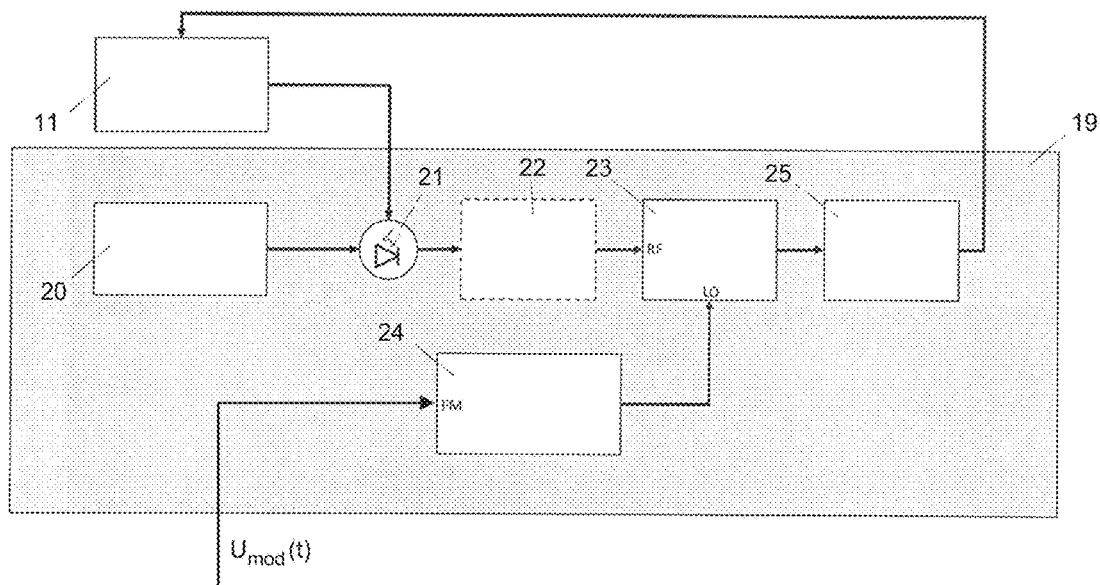
FIG. 7 is a schematic view of a phase-locked loop for the frequency modulation of the laser source in the laser system from FIG. 6.

The laser system in FIG. 6 for generating an artificial guide star is constructed similarly to the system in FIG. 3. It uses a frequency-modulated laser 11. The frequency-modulated laser radiation at 1178 nm is generated by means of an optical phase-locked loop 19, the details of which are shown in FIG. 7. Said loop operates by coupling the laser 11 to a fixed-frequency reference laser 20 having a modulated offset frequency, i.e. the optical frequency of the laser 11 is locked to the optical frequency of the fixed-frequency reference laser with a frequency offset, which corresponds to the desired frequency modulation in accordance with the sawtooth-shaped modulation signal $U_{mod}(t)$. In this way, the optical frequency of the laser 11 can be based on a frequency normal (by the fixed-frequency reference laser 20 being based on a frequency normal, e.g. a calibrated wavelength-measuring device or an atom or molecule resonance). For the coupling, the laser radiation of the laser 11 and the laser radiation of the fixed-frequency reference laser 20 are superposed on a photodetector 21. The frequency and phase of the resulting beat signal are detected by means of a suitable phase/frequency detector (PFD) 23 (optional after passing a frequency-divider stage 22). The frequency-divider stage 22 may be advantageous for increasing the uniqueness range of the PFD 23 and therefore for obtaining stable coupling even at laser-line widths in the MHz range. A high-frequency signal that has been frequency-modulated by a defined offset frequency in accordance with the modulation signal $U_{mod}(t)$ is generated by means of a HF signal generator 24, which is actuated by the modulation-signal generator 2. When determining the modulation amplitude of the high-frequency signal, potential frequency division in the frequency-divider stage 22 needs to be taken into account. A PID controller 25 stabilizes the detection signal of the PFD 23, such that, as a result, the laser radiation of the laser 11 is frequency-modulated relative to the fixed-frequency reference laser 20 in accordance with the modulation signal $U_{mod}(t)$. In this process, the HF signal generator 24 predetermines the modulation amplitude and the offset frequency compared with the frequency of the fixed-frequency reference laser 20.

The laser 11 is e.g. a diode laser, wherein the PID controller 25 controls the injection current of the laser diode (not shown) in order to modulate the frequency.

An additional frequency modulation superposed on the above-described frequency modulation is also carried out, wherein the associated details are not shown in FIGS. 6 and 7 for the sake of clarity. This additional modulation is carried out at two frequencies simultaneously. One modulation frequency is 1.7 GHz. By means of this modulation frequency, the spectrum of the radiation emitted by the laser light source 11 obtains a sideband at 1.7 GHz relative to the carrier frequency modulated in a sawtooth shape in accordance with the modulation signal $U_{mod}(t)$. This sideband is ultimately a basis for the generation of radiation at the back-pumping frequency according to the hyperfine splitting of the sodium D-line. The additional modulation frequency is in the range between 5 and 100 MHz. By means of this modulation, yet another sideband is generated, which serves to provide coupling to the optical resonator 1 in accordance with the Pound-Drever-Hall method by means of the error-signal detector 5.

The thus frequency-modulated laser radiation of the laser 11 is amplified in an optical amplifier 26. A Raman fiber amplifier, as described in EP 2 081 264 A1, is suitable, for example. The Raman fiber amplifier 26 amplifies the frequency-modulated radiation of the laser 11. The amplification bandwidth of the Raman fiber amplifier 26 is accordingly large. At the output of the Raman fiber amplifier 26, the power of the laser radiation is approx. 30 to 40 W.

The proposed control and adaptive feed-forward control method is then used to make the resonant frequency of the optical resonator 1 precisely follow the frequency of the laser 11 which has been chirped in a sawtooth-shaped manner. The amplified laser radiation is resonantly frequency-multiplied. To do this, a non-linear crystal (not shown) is used, which is located inside the optical resonator 1. In this process, the amplified laser radiation is converted by frequency multiplication and sum-frequency generation. The spectrum of the laser radiation at the output of the optical resonator includes intensities at the (chirped) sodium fluorescence frequency and the back-pumping frequency at a fixed relative frequency distance therefrom.

Another application of the proposed combined control and adaptive feed-forward control comes about in the modulation of the resonant frequency of an ECDL or VECSEL resonator. In a VECSEL, effects such as spectral hole burning can make it difficult to achieve high power output in single-frequency operation. Such effects can be reduced by modulation of the optical path length of the resonator. In this respect, the proposed method can be used for a defined periodic modulation (at fundamental frequencies of 1-100 kHz) of the optical path length of the VECSEL resonator, e.g. by periodic tilting, rotating or otherwise moving a frequency-selective resonator element, such as an etalon.

What is claimed is:

1. A method for modulating a resonant frequency of an optical resonator in accordance with a periodic modulation signal, comprising the following method steps:
    deriving an error signal from a light field circulating in the resonator, wherein the error signal indicates a deviation of an optical frequency of the light field from an intended resonant frequency predetermined by said periodic modulation signal,
    deriving a first actuating signal from the error signal by means of a controller,
    generating a second actuating signal, which has actuating-signal components at a plurality of at least two higher harmonics of a fundamental frequency of the modulation signal, and
    applying a superposition signal made up of the first and the second actuating signal to an actuator that changes an optical path length of the resonator, so that the resonant frequency of the optical resonator follows the modulation signal.

2. The method according to claim 1, wherein a phase and an amplitude of each actuating-signal component of the second actuating signal are individually set such that the amplitude of the error signal is minimal at the associated harmonics.

3. The method according to claim 1, wherein the second actuating signal is derived from the error signal.

4. The method according to claim 3, wherein each actuating-signal component is generated by
    phase-sensitive demodulation of the error signal at the associated harmonics,
    transfer of a resulting complex detection signal into a complex control signal in accordance with a transfer function and
    modulation of the associated harmonics in accordance with the complex control signal.

5. The method according to claim 4, wherein an individual transfer function is associated with each actuating-signal component.

6. The method according to claim 4, wherein the transfer function is adapted such that the amplitude of the error signal is minimized at the associated harmonics.

7. The method according to claim 1, wherein the optical resonator is a laser resonator and the intended resonant frequency predetermined by said modulation signal is a fixed frequency of a reference laser applied with an offset that varies in accordance with the modulation signal.

8. The method according to claim 1, wherein the optical resonator is a laser resonator of a laser to be frequency-modulated and wherein the error signal is generated by coupling the laser to be frequency-modulated to an additional, passive optical resonator, the resonant frequency of which is modulated in accordance with the modulation signal.

9. The method according to claim 1, wherein the optical resonator is a passive optical resonator and wherein the error signal is generated by coupling to a laser which is frequency-modulated in accordance with the modulation signal.

10. The method according to claim 9, wherein a laser radiation of the frequency-modulated laser is amplified and is converted by resonant frequency multiplication and/or sum-frequency generation by means of a non-linear optical crystal in the optical resonator.

11. The method according to claim 10, wherein a spectrum of the converted laser radiation has a fluorescence frequency, which corresponds to an optical transition in an atom, i.e. a line in an electronic excitation spectrum of the atom, and a back-pumping frequency, a distance of which from the fluorescence frequency corresponds to a hyperfine splitting of the optical transition.

12. The method according to claim 11, wherein the fluorescence frequency is modulated in a sawtooth shape in accordance with the modulation signal, wherein a fundamental frequency of the modulation signal is 1-50 kHz, preferably 5-10 kHz, and a modulation amplitude of the fluorescence frequency is 5-500 MHz, preferably 100-300 MHz.

13. The method according to claim 10, wherein the fluorescence frequency corresponds to a wavelength of the sodium line at 589 nm and the frequency distance of the back-pumping frequency from the fluorescence frequency is +/−1.7 GHz.

14. A system comprising
    an optical resonator,
    at least one actuator, which is configured to change an optical path length of the resonator,
    a modulation-signal generator, which is configured to generate a periodic modulation signal,
    an error-signal detector, which is configured to derive an error signal from a light field circulating in the resonator, wherein the error signal indicates a deviation of an optical frequency of the light field from an intended resonant frequency predetermined by said periodic modulation signal,
    a controller, which is configured to derive a first actuating signal from said error signal,
    a feed-forward control apparatus, which is configured to generate a second actuating signal, which has actuating-signal components at a plurality of at least two higher harmonics of a fundamental frequency of the modulation signal,
    wherein the controller and the feed-forward control apparatus are connected to the actuator, such that a superposition signal made up of the first and the second actuating signal is applied to said actuator.

15. The system according to claim 14, wherein the feed-forward control apparatus has a multi-channel structure, wherein each channel is assigned to an actuating-signal component of the second actuating signal and wherein each channel comprises:
    an IQ demodulator, which is configured to generate a complex detection signal by phase-sensitive demodulation of the error signal at the associated harmonics, an IQ controller, which is connected downstream of the IQ demodulator and is configured to convert the complex detection signal into a complex control signal in accordance with a transfer function, an IQ modulator, which is connected downstream of the IQ controller and is configured to generate the actuating-signal component by modulation of the associated harmonics in accordance with the complex control signal, wherein the feed-forward control apparatus comprises an adder, which is connected to the IQ modulators of all the channels and is configured to generate the second actuating signal by addition of the actuating-signal components.

16. The system according to claim 15, wherein the IQ controller of each channel is configured to adapt the transfer function such that the amplitude of said complex detection signal is minimized.

17. The system according to claim 14, wherein the optical resonator is a laser resonator and wherein the error-signal detector is configured to generate the error signal by coupling the laser resonator to a reference laser that emits at a fixed frequency, wherein the intended resonant frequency predetermined by said modulation signal is a fixed frequency of a reference laser applied with an offset that varies in accordance with the modulation signal.

18. The system according to claim 14, wherein the optical resonator is a laser resonator of a laser to be frequency-modulated and wherein the error-signal detector is configured to generate the error signal by coupling the laser resonator of the laser to be frequency-modulated to an additional, passive optical resonator, the resonant frequency of which is modulated in accordance with the modulation signal.

19. The system according to claim 17, wherein the optical resonator is the external resonator of a VECSEL or ECRL.

20. The system according to claim 14, wherein the optical resonator is a passive optical resonator and wherein the error-signal detector is configured to generate the error signal by coupling the passive optical resonator to a laser which is frequency-modulated in accordance with the modulation signal.

21. The system according to claim 20, wherein a non-linear optical crystal is located in the passive optical resonator, which is configured to convert the laser radiation of the frequency-modulated laser by resonant frequency multiplication and/or sum-frequency generation.

22. The system according to claim 21, wherein the spectrum of the converted laser radiation has a fluorescence frequency, which corresponds to an optical transition in an atom, i.e. a line in the electronic excitation spectrum of the atom, and a back-pumping frequency, the distance of which from the fluorescence frequency corresponds to a hyperfine splitting of the optical transition.

23. The system according to claim 22, wherein the modulation signal is sawtooth-shaped, wherein a fundamental frequency of the modulation signal is 1-50 kHz, preferably 5-10 kHz, and the resulting modulation amplitude of the fluorescence frequency is 5-500 MHz, preferably 100-300 MHz.

24. The system according to claim 23, wherein the fluorescence frequency corresponds to the wavelength of the sodium line at 589 nm and the frequency distance of the back-pumping frequency from the fluorescence frequency is +/−1.7 GHz.

* * * * *